ELECTRONIC COMPUTING CIRCUITS UTILIZING ENHANCEMENT AMPLIFIERS

Filed April 26, 1956

3 Sheets-Sheet 1

INVENTORS
HARRY L. MASON
DAVID L. NOBLE
BY [signature]
ATTORNEY

INVENTORS
HARRY L. MASON
DAVID L. NOBLE
BY Louis Etlinger
ATTORNEY

Oct. 13, 1959 H. L. MASON ET AL 2,908,830

ELECTRONIC COMPUTING CIRCUITS UTILIZING ENHANCEMENT AMPLIFIERS

Filed April 26, 1956

3 Sheets-Sheet 3

INVENTORS
HARRY L. MASON
DAVID L. NOBLE
BY
ATTORNEY

United States Patent Office 2,908,830

Patented Oct. 13, 1959

2,908,830

ELECTRONIC COMPUTING CIRCUITS UTILIZING ENHANCEMENT AMPLIFIERS

Harry L. Mason, Noroton, and David L. Noble, Rowayton, Conn., assignors to Sperry Rand Corporation, New York, N.Y., a corporation of Delaware Application April 26, 1956, Serial No. 580,935

37 Claims. (Cl. 307—88.5)

This invention relates generally to electronic circuits utilizing principles of reverse transient phenomenon of certain rectifier devices, and more particularly to such circuit arrangements useful in electronic computers.

Due to the complexity of digital electronic computers, which require the utilization of a large number of vacuum tubes with their inherent lack of reliability, efforts have been directed to the replacement of tubes with more reliable devices which are smaller and lighter and consume less power. Transistors have been applied to computers, but thus far have proven unsuccessful in applications where operation at relatively high frequencies is required.

It is, therefore, an object of this invention to provide computer circuits using semi-conductor devices utilizing the phenomenon of diode enhancement, which can operate at relatively high frequencies.

Another object of this invention is to provide a binary digital logical circuit made up of semi-conductor amplifier units utilizing the phenomenon of diode enhancement.

A further object is to provide a binary half-adder which includes amplifiers, Or amplifiers, And amplifiers, and Inhibit amplifiers utilizing the phenomenon of diode enhancement.

An additional object is the provision of amplifiers utilizing diode enhancement having an inductive element in the input circuit wherein the noise level due to buildup of D.C. voltages is prevented.

Another additional object is the provision of an enhancement amplifier which performs as a dynamic trigger circuit having two stable states without requiring external delay circuits.

In carrying out the invention, a basic enhancement amplifier circuit with a double ended output utilizing two semi-conductor devices having a reverse transient characteristic is modified, as shown hereinafter, and arranged as an amplifier, as an Or amplifier, as an And amplifier, and as an Inhibit amplifier, is used to make up a binary half-adder to carry out the addition of two binary digital numbers, each of which is represented by a series of electrical signals. By utilizing two of these half-adders, in a manner known to the computing art, a full adder can be constructed. Also, by providing the basic amplifier with a feedback path and source of Off pulses the basic amplifier is converted to a trigger circuit having two stable states.

Among the advantages of the basic amplifier disclosed herein, an amplifier is provided which has higher gain than those known to the enhancement art with a low signal-to-noise ratio, while at the same time requiring fewer components.

The theory and the utilization of the reverse transient phenomenon of certain rectifying devices such as crystal diodes, known as diode enhancement, has been taught in abandoned applications Serial No. 508,371, filed on May 18, 1955 and Serial No. 499,353 filed on April 19, 1955. Briefly restated, when a semiconductor diode has a forward current flowing therethrough, this current will tend to effect storage of an excess of holes or electrons in the lattice of the solid state material used, whereupon if the semiconductor is then subject to an inverse voltage large enough to cut off the forward current, a reverse transient current initially flows which may, in fact, exceed the forward current in magnitude. This transient current which ordinarily decays after a relatively short time interval to the normal value of back leakage current, results from the applied inverse voltage sweeping out unrecombined injected carriers from the semiconductor diode. This transient phenomenon effected by the applied inverse voltage is designated as "enhancement." Though the enhancement phenomenon is exhibited to some degree by all semiconductors utilizing material into which carriers can be injected, certain materials and geometries produce relatively greater enhancement currents than others. For example, germanium exhibits a greater enhancement effect than does silicon, and junction diodes more than do point contact types. The term "enhancement diode" is a relative term and used hereafter refers to a type of diode which exhibits a greater enhancement effect than other types of diodes employed in the same device.

Other objects and advantages of the invention will be apparent from the following description, in which reference is made to the accompanying drawings wherein.

Figure 1:
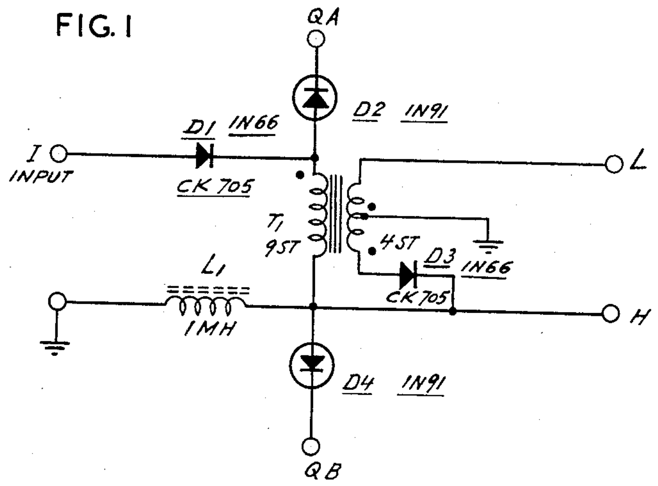
Fig. 1 is a schematic diagram of the basic double diode amplifier circuit.

Referring to Fig. 1, the input signal to the basic amplifier unit is fed to input terminal I connected to the anode of the unilateral impedance $D_1$ whose cathode is in turn connected to the primary of the transformer $T_1$.

The other side of the primary of $T_1$ is connected through an inductance $L_1$ to a return point, which serves as the second input terminal and which is shown as being grounded in Fig. 1.

A first clock signal is applied to terminal QA, which is connected to the cathode of the enhancement diode $D_2$. The anode of diode $D_2$ is in turn connected to the primary of the transformer $T_1$. A second clock signal, which is 180° out of phase in relation to the signal applied to terminal QA, is applied to terminal QB connected to the other end of the primary of transformer $T_1$ through the enhancement diode $D_4$. The cathode of the diode $D_4$ is connected to terminal QB, while its anode is connected to the junction of the primary of transformer $T_1$ and the inductor $L_1$. One output of the amplifier is taken from the secondary of the transformer $T_1$ at the output terminal L connected directly to one end of the secondary. A second output is taken from terminal H which is connected to the other end of the secondary of the transformer through a unilateral impedance $D_3$. The cathode of impedance $D_3$ is joined with the anode of the enhancement diode $D_4$, the primary of transformer $T_1$, and the inductance $L_1$. The center tap of the secondary winding of the transformer $T_1$ is connected to a return point, which is shown as ground in Fig. 1. The foregoing arrangement of the output circuit is for illustrative purposes only. Other combinations of the output circuit can be used.

In the embodiment shown in Fig. 1, the germanium junction diode having the commerical designation of 1N91 is used for the enhancement diodes $D_2$ and $D_4$. The point contact type of diode, known by its commercial designation of CK705, is used for diodes $D_1$ and $D_3$. The above diodes are cited merely by way of example and other suitable types of diodes of either the junction or point contact type, or transistors of either the junction or point contact type connected as diodes, can be used. However, for efficient operation the diodes $D_1$ and $D_3$ should be of the type that exhibit a low reverse transient characteristic in comparison to the diodes $D_2$ and $D_4$.

The preferred characteristics of the clock supply are as follows:

The clock source frequency must be the same or higher than the lowest signal frequency applied to the input I. The clock voltage must not exceed the breakdown voltage of the enhancement diode. In the embodiment shown, a clock voltage of approximately 50 volts was used. For efficient operation the impedance of the clock source should be low during that portion of the cycle when the clock voltage is at zero volts, so that the minimum amount of power is dissipated by the clock source.

Although the wave form of the clock signal in the embodiment shown is approximately that of a half sine wave during the positive periods, clock pulses of other suitable wave forms may be used as long as they are 180° out of phase and symmetrical; and one of the clock voltages is at zero volts during the time the other is positive and vice versa.

With respect to the parameters of the transformer $T_1$, it is preferred that the transformer be designed to operate with such flux densities that the core material does not become saturated with the signals being handled. The number of turns of the secondary circuit should be less in number than that of the primary. In the embodiment shown, there were 95 turns in the primary and 45 turns in the secondary.

In order to reduce the flyback and permit the amplifier to operate with high duty cycle pulses and make it possible for the transformer primary to give up its stored energy readily, the transformer should be designed so that its natural frequency is slightly higher than the clock source. This permits full recovery of the transformer before the next pulse occurs.

The function of the inductor $L_1$ is to reduce the noise level by preventing the buildup of small positive D.C. voltages across the anodes of the enhancement diodes $D_2$ and $D_4$ which would cause self-injection of carriers in both diodes without the low D.C. resistance return provided by the inductor. The effect of the D.C. voltage would be cumulative and a high noise level would result.

The value of $L_1$ should be such that it will offer a high impedance to signal pulses and offer a low resistance to D.C. voltages.

In the embodiment shown $L_1$ has a value of approximately one millihenry.

Figure 2:
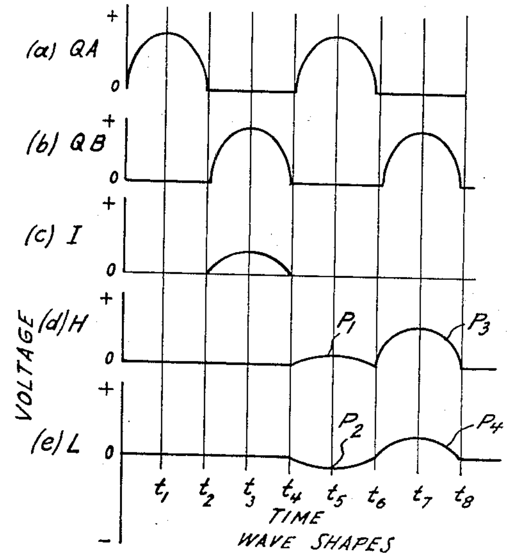
Fig. 2 is a drawing showing the wave forms associated with the operation of the basic amplifier.

In describing the operation of the circuit in Fig. 1, reference is made to Fig. 2 as well, which shows the wave forms that appear at various points of the circuit.

Diode amplification is accomplished by injecting carriers into a diode at a low energy level and recovering these carriers at a higher energy level. Amplification is obtained by virtue of the fact that the collector circuit impedance is made much higher than that of the emitter circuit, the power gain being nearly equal to the ratio of the emitter impedances.

Since a diode has only two elements or terminals the carriers must be injected and recovered through the same elements. The carriers are injected into the enhancement diode $D_2$ by means of a positive pulse applied to the input terminal I. Diode $D_1$, which is of the point contact type, has relatively few carriers injected at the currents involved in carrying out the invention. When the input pulse shown in Fig. 2(*c*), starting at time $t_2$ is applied, the clock signal appearing at terminal QA and shown in Fig. 2(*a*) is at ground level, while the clock signal applied at terminal QB is at a positive level. The input pulse at this time causes current to flow through the diode $D_1$, the enhancement diode $D_2$ and the low impedance clock power source, thus causing carriers to be injected into the diode $D_2$. Since the phase B clock signal applied to QB is at its positive level, diode $D_4$ is non-conductive and diode $D_3$ is similarly non-conductive, no current will flow through the transformer primary.

At time $t_4$ the clock signal (Fig. 2(*a*)) applied at QA begins to go positive, while the clock voltage applied to QB has already fallen to ground level. During this time, the carriers from the enhancement diode $D_2$ cause a current to flow through the primary of transformer $T_1$ the diode $D_4$ and the low impedance clock supply connected to terminal QB.

The flow of current through the primary of $T_1$ causes an output voltage to appear at output terminal H and output terminal L, shown respectively in Figs. 2(*d*) and 2(*e*) as $P_1$ and $P_2$.

The current flowing through the enhancement diode $D_4$ injects carriers into this diode. During the same interval the higher current, which is developed in the secondary of the transformer $T_1$ due to its lower turn ratio than the primary, flows through the diode $D_3$ and injects many more additional carriers in the enhancement diode $D_4$ than the original input signal did in the enhancement diode $D_2$. At time $t_6$, when clock A goes back to ground level and clock QB begins to return to its positive level, the carriers in the enhancement diode $D_4$ cause a current to flow in the primary of transformer $T_1$ through the low impedance clock QA source. The current that flows, as a result of the carriers collected in diode $D_4$, is much greater than the current flow which resulted from the carriers of the diode $D_2$. The wave form of the voltages appearing at the output terminals H and L is shown in Figs. 2(*d*) and 2(*e*) respectively as pulses $P_3$ and $P_4$.

Figure 3:
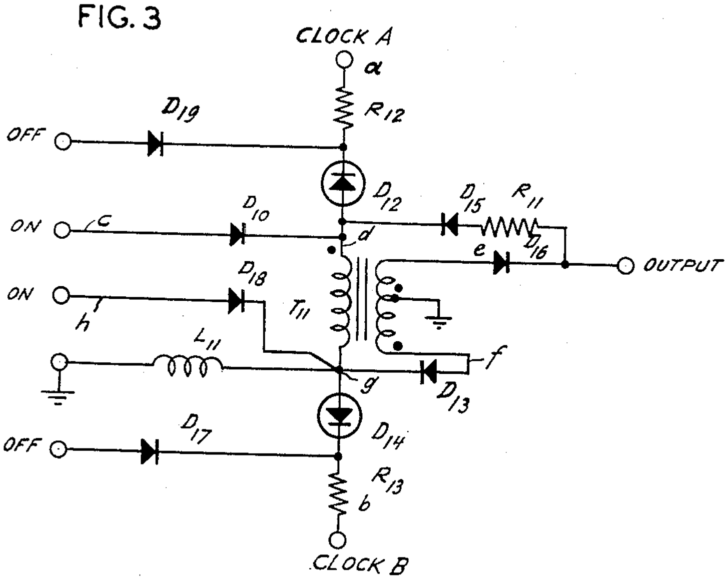
Fig. 3 is a schematic diagram of the amplifier which performs as a dynamic trigger circuit.

A modification of the invention is shown in Fig. 3, which operates as a dynamic trigger circuit having two stable states without an external delay device. The invention utilizes the inherent delay within the circuit to make the circuit self-sustaining.

Referring to Fig. 3, the circuit of Fig. 1 has been modified by the provision of a feedback path to the input from the output consisting of the resistor $R_{11}$ and the rectifier $D_{15}$. The resistors $R_{12}$ and $R_{13}$ have been added to the clock circuits in series with the inputs of clocks A and B.

Rectifiers $D_{16}$ and $D_{17}$ have been added which are connected to the cathodes of rectifiers $D_{12}$ and $D_{13}$ and are poled to pass a positive signal. The rectifiers $D_{16}$ and $D_{17}$ may be connected to two separate signal sources or one common signal source. A single output is taken from the secondary of the transformer $T_{11}$ through the rectifier $D_{16}$ which is arranged to pass positive pulses or signals.

A second On or input circuit has been added connected to the junction of rectifier $D_{14}$ and the primary of transformer $T_{11}$.

The rectifier $D_{18}$ is poled to pass positive signals only. The second On or input circuit has been added so that the trigger circuit of Fig. 3 will be turned on upon the application of an On pulse without the necessity of timing the On pulse to occur at the time the enhancement diode $D_{12}$ is made conductive by the clock A signal being at ground level.

With the provision of the second input, or On circuit, the trigger circuit goes on when either the signal of clock A or clock B is at ground level.

The input or On signals can be applied simultaneously to both On inputs from two separate signal sources, or the two input paths can be tied to a common signal source.

If the input or On signal is synchronized with clock A, so that it is to be turned on only when the signal of clock A is at ground potential, the second input signal path to point $g$ can be eliminated.

Figure 4:
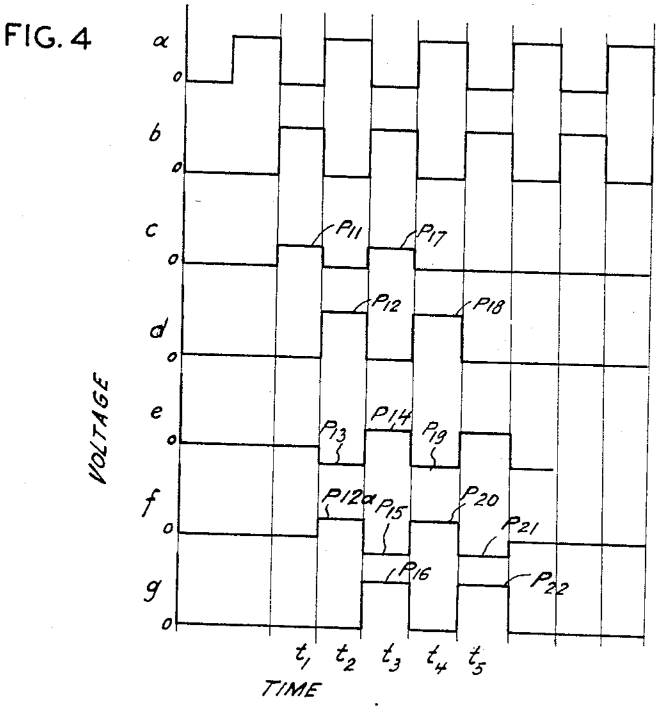
Fig. 4 is a drawing showing the wave forms associated with the operation of the circuit shown in Fig. 3.

In describing the operation of the circuit shown in Fig. 3, reference is made to Fig. 4 which represents the wave forms appearing at selected points of the circuit shown in Fig. 3. The designation given to each train of pulses is the same as that given to the point in the circuit where the pulse train appears. For example, the pulses appearing at point $a$ of the circuit are shown in Fig. 4 on line $a$.

Clock pulses 180° out of phase with each other are applied to points $a$ and $b$. When an input or On pulse $P_{11}$ is applied to point C at time $t_1$, diode $D_{14}$ is non-conductive due to the positive pulse of clock B. Diode $D_{12}$ is in a conductive state since its cathode is negative with respect to the anode due to the clock A pulse being at ground level. Current now flows from point $c$ through the rectifiers $D_{10}$ and $D_{12}$, the resistor $R_{12}$ and through the low impedance clock A source storing carriers in rectifier $D_{12}$.

During the next cycle time $t_2$, the clock A signal goes positive, the clock B signal returns to ground level and rectifier $D_{14}$ becomes conductive, thus permitting the carriers stored in the diode $D_{12}$ to cause current to flow through the primary of the transformer $T_{11}$, diode $D_{14}$, the resistor $R_{13}$ and the low impedance of clock B source. The positive pulse $P_{12}$ appears at point $d$ in the circuit and the negative pulse $P_{13}$ appears in the secondary circuit of $T_{11}$ at point $e$. Simultaneously, pulse $P_{12a}$ appears at the other terminal of $T_{11}$ at point $f$.

During $t_2$, current flowing through both the primary and secondary of transformer $T_{11}$ causes carriers to be accumulated in diode $D_{14}$.

The negative pulse $P_{13}$ appearing at point $e$ is prevented from being fed back through by the rectifiers $D_{16}$ and $D_{15}$ which are poled to pass positive pulses only.

During the next time interval $t_3$, when the diode $D_{12}$ becomes conductive, the carriers accumulated in the enhancement diode $D_{14}$ cause a current to flow through the primary of $T_{11}$, the enhancement diode $D_{12}$, the resistor $R_{12}$ and the impedance of clock source A. The flow of current produces the positive pulse $P_{16}$ at point $g$ and the positive pulse $P_{14}$ at point $e$. The positive pulse $P_{14}$ appearing at point $e$ is passed by the rectifier $D_{16}$ and is fed back to the input circuit to point $d$ by the feedback path consisting of the resistor $R_{11}$ and the rectifier $D_{15}$.

The rectifier $D_{15}$ is poled to pass positive signals only and the resistor limits the signal amplitude.

The feedback signal is shown in Fig. 4($c$) as pulse $P_{17}$. The operation of the circuit after the feedback pulse $P_{17}$ is applied to point $d$ is the same as previously described in connection with the input pulse $P_{11}$.

Reference to Fig. 4 will show that the pulses $P_{18}$, $P_{19}$ and $P_{20}$, appearing during time $t_4$, are similar to pulses $P_{12}$, $P_{13}$ and $P_{12a}$ which appeared during time $t_2$.

Similarly, the pulses appearing during time $t_5$ are similar to those appearing during time $t_3$.

The circuit will continue to produce pulses at the output which are similar to $P_{13}$ and $P_{14}$ until an Off pulse is applied to the Off terminals. The Off pulse for the circuit shown is of positive polarity and should be of sufficient amplitude to prevent conduction in the enhancement diodes $D_{12}$ and $D_{14}$.

The minimum required amplitude of the Off pulse is a value at least equal to the values of the input pulse $P_{11}$ or the feedback pulse $P_{17}$, whichever is greater.

The application of positive Off pulses to the Off terminals cause the circuit to remain in an Off condition, that is, without an output signal at the output terminal until the application of an On pulse.

The effect of the On signal appearing at point $g$, which was applied simultaneously with the On signal appearing at point $d$, is negligible since rectifiers $D_{14}$, $D_{13}$ and $D_{17}$ do not permit this signal to pass.

In the foregoing description, the operation of the circuit has been described on the assumption that the clock B signal was positive at the time of application of the On pulse. The circuit operates and will produce output signals when the On pulse is applied during the time the clock A signal is positive. The operation of the circuit is generally the same, except that in this case the main current will flow through rectifier $D_{18}$, the rectifier $D_{14}$, the resistor $R_{13}$ and the source impedance of clock B. The negative pulse appearing at point $e$ is blocked by the rectifier $D_{16}$. During the next clock pulse, the carriers cause a current to flow in the reverse direction, namely the primary of $T_{11}$, the rectifier $D_{12}$, the resistor $R_{12}$ and the source impedance of clock A. The flow of current produces a positive output pulse similar to $P_{14}$ which is fed back to point $d$. During the next time interval the process is repeated and continues until Off pulses are applied to turn the circuit off.

The effect of the input signal applied at point $d$ is similarly negligible due to rectifiers $D_{12}$, $D_{15}$ and $D_{16}$.

Figure 5:
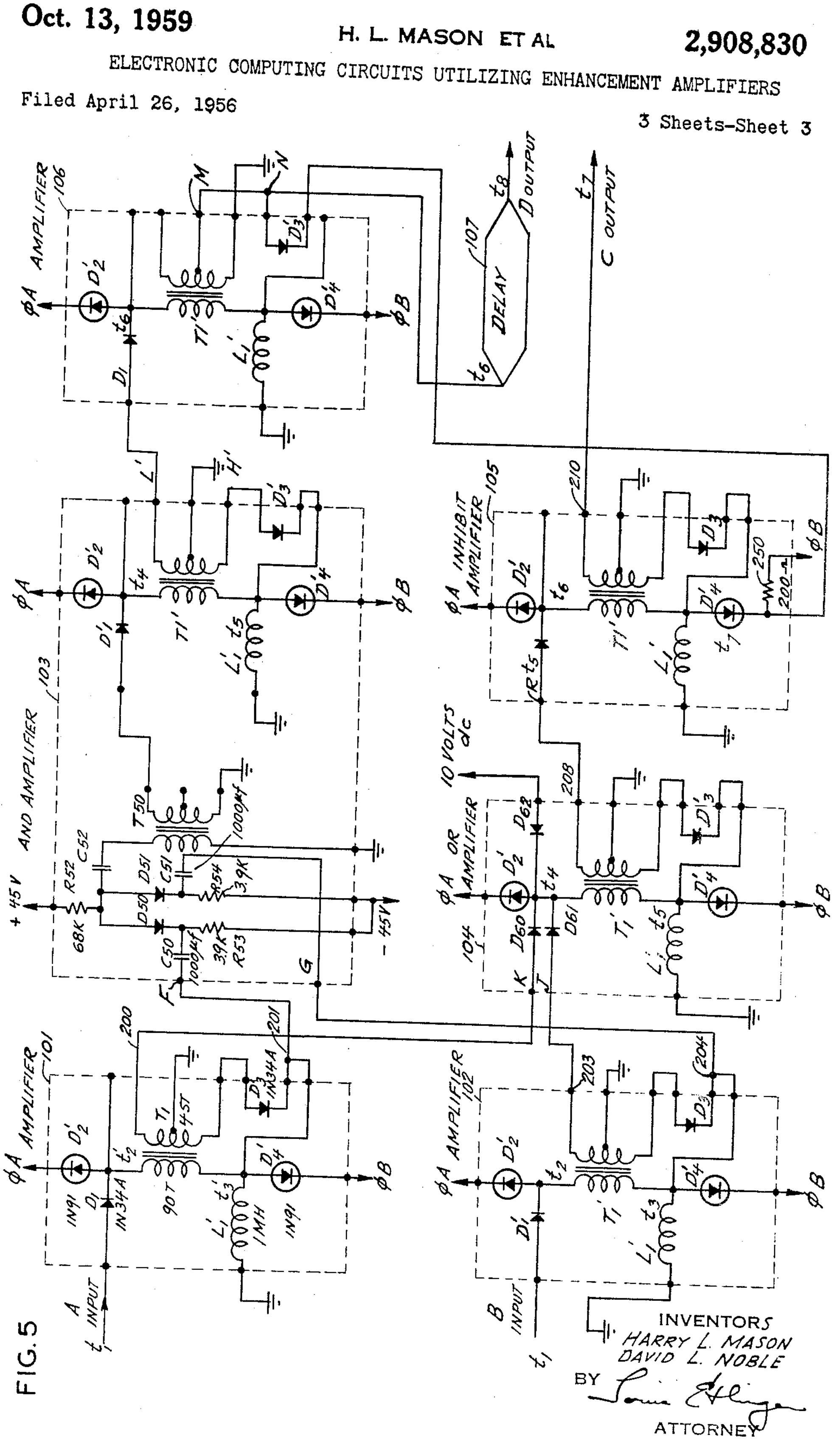
Fig. 5 is a schematic diagram of a binary half-adder for use in a digital computer, wherein each functional circuit is included within dotted lines and appropriately labeled as to its function.

The invention is further illustrated by Fig. 5 representing the schematic circuit diagram of a binary half-adder utilizing double diode enhancement amplifiers, which have been modified to perform the functions of And, Or and Inhibit.

The binary half-adder shown has two input terminals labeled, respectively, A and B and two output terminals labeled C and D, and is arranged to produce output signals for combinations of input signals in accordance with the following rules or conditions complying with the rules for addition of binary numbers.

For purposes of illustration, the notation herein adopted is where the presence of a signal represents a binary "one" and the absence of a signal represents a binary "zero."

| A. Input | B. Input | C. Output | D. Output |
|---|---|---|---|
| 0 | 0 | 0 | 0 |
| 1 | 0 | 1 | 0 |
| 0 | 1 | 1 | 0 |
| 1 | 1 | 0 | 1 Carry |

The circuit for implementing these rules consists of diode enhancement amplifiers based on the amplifiers of Fig. 1, which have been modified, as hereinafter described, to perform the required functions. Referring to Fig. 5, the input signals are applied to the inputs of amplifiers 101 and 102. Both of these amplifiers have dual outputs and output 200 of amplifier 101 feeds the input terminal K of the Or amplifier 104, while the other output 201 of amplifier 101 is connected to the input terminal F of the And amplifier 103. Similarly, output 203 of amplifier 102 feeds the second input terminal J of the Or amplifier 104, while the second output terminal 204 of amplifier 102 is connected in the second input terminal G of And amplifier 103.

The Or amplifier 104 is further modified by the provision of the clamping circuit consisting of rectifier $D_{62}$ connected to a source of positive D.C. potential. In the embodiment shown a D.C. potential of 10 volts was used to limit the signal output of amplifier 104 in accordance with other signal levels of the system.

In the amplifier 106 the two output terminals M and N are used. Terminal M is connected through the delay device 107 to the D output terminal. The same output terminal M of the amplifier 106 is connected to the Inhibit amplifier 105 through the $D_3'$ rectifier of amplifier 106 to the cathode of the enhancement amplifier $D_2'$ of amplifier 105. The other terminal N is connected to a common return point shown as ground. Or amplifier 104 has a single output which is connected to the single signal input terminal R of the Inhibit amplifier 105. The single output of the Inhibit amplifier 105 is brought out as the C output terminal of the half-adder.

It will be noted by referral to Fig. 5, that all the amplifiers are essentially of identical construction except for the input circuits and the output connections. This permits the use of modular units thus facilitating the fabrication and assembly of the adder unit. Amplifiers 101, 102 and 106 are identical and the same as the basic amplifier shown in Fig. 1. And amplifier 103 consists of the basic amplifier plus an input circuit which will not produce an output unless signals appear simultaneously at both terminals F and G. This condition of operation is carried out by arrangement of the components, wherein the input from the terminals F and G each goes through a condenser $C_{50}$ and $C_{51}$, respectively, to the cathodes of diodes $D_{50}$ and $D_{51}$, respectively. One end of the resistors $R_{53}$ and $R_{54}$, respectively, is connected to the junction of the cathode of diodes $D_{50}$ and $D_{51}$, respectively, and condensers $C_{50}$ and $C_{51}$. The other end of the resistors $R_{53}$ and $R_{54}$ are connected together to a source of negative potential, which is shown in the drawings for the embodiment described as —45 volts. The anode of the rectifiers $D_{50}$ and $R_{51}$, respectively, are joined together at one end of the resistor $R_{52}$ and one terminal of capacitor $C_{52}$. The other end of the resistor $R_{52}$ is connected to a source of positive D.C. potential which is shown in the figure as 45 volts. The other side of capacitor 52 is connected to the primary of transformer $T_{50}$. The other end of the primary is grounded. One end of the secondary of transformer $T_{50}$ is connected to the input of the amplifier portion of the And amplifier 103, while the other end of the secondary is grounded. While the primary and secondary and an inductance of amplifier 103, as well as other terminals of the adder, are shown as being returned to ground, it is not necessary for the operation that these do so as long as they return to a common reference point.

The Or amplifier 104 differs from the basic amplifier in only one respect, that is, an additional input circuit having rectifier $D_{61}$ in series poled to pass positive pulses has been provided connected to the primary of the amplifier transformer. Another deviation from the basic amplifier is the provision of rectifier $D_{62}$, the function of which has already been mentioned.

Inhibit amplifier 105 is the same as a basic amplifier, except that an additional inhibit input is supplied to the cathode of the lower enhancement diode $D_4'$ and the isolating resistor 250 has been interposed between the clock source and diode $D_4'$.

Amplifier 106 is the same as the basic amplifier except for the arrangement of the output terminals where the output signals are taken from the center tap of the output transformer. The clock voltages applied to all the amplifiers of Fig. 5 are identical for all A clock inputs and similarly the clock voltages are identical for all B clock inputs. The clock voltages of A clock are 180° out of phase with the B clock voltages and one of the clock voltages is to be at a positive potential while the other is at approximately ground level.

The operation of the basic amplifier unit has already been described heretofore in connection with Figs. 1 and 2, and need not be repeated here in describing the operation of the binary half-adder circuit shown in Fig. 5.

As seen from the previous explanation of the basic amplifier, no output signal is produced by the amplifier in the absence of an input signal. Therefore, for the case where no signals are applied to either the A or B input, no signal appears at either the C or D output indicating binary zeros, thereby meeting the first rule of a digital binary half-adder whereby the sum of two binary zeros are equal to binary zero.

Taking the second rule or condition, that is, where there is a signal representing a binary "one" appearing at the A input and no signal representing a binary "zero" at the B input.

The timing of the signals resulting from input signals applied to terminals A and B is indicated in Fig. 5 at various points throughout the adder circuit by the letter $t$ with a number subscript after it. The subscript number indicates the time interval that has passed since the application of the signals to the input terminals A and B at the initial time interval $t_1$.

The absence of a signal indicating a binary "zero" on terminal B at interval $t_1$ will, as mentioned previously, result in the absence of a signal at the output of amplifier 102. The signal at terminal A at $t_1$ representing a binary "one" results in an output signal at both the 200 and 201 outputs of amplifier 101.

The signal from the 201 output is applied to terminal F of And amplifier 103. Since there is no signal at terminal G from the output of amplifier 102 to cut off the diode $D_{51}$, this diode continues to conduct and provides a low impedance path for the signal appearing at terminal F and no signal appears at the output of transformer $T_{50}$.

The signal from the output of amplifier 101 applied to terminal K of Or amplifier 104 causes a signal to appear at the output terminal of this amplifier at time $t_4$. Since there is no signal output from And amplifier 103, there is, correspondingly, no signal output from the amplifier 106 and at the half-adder output terminal D.

The signal from the Or amplifier 104 appears at the input terminal R of the Inhibit amplifier 105 at time $t_5$. With no signal from amplifier 106 applied to the cathode of diode $D_4'$ of amplifier 105 to inhibit the action of this amplifier by cutting off diode $D_4'$ and thus preventing conduction in the primary circuit of the transformer $T_1'$, an output signal appears at terminal 210 of this amplifier and consequently at the added output terminal C. Thus, the rule of binary arithmetic has been satisfied which requires that the sum of a binary "one" and a binary "zero" is equal to a binary "one" without a carry.

Compliance of the adder with the third rule of binary addition is demonstrated when a signal representing a binary "one" appears at terminal B and the absence of a signal representing a binary "zero" occurs at terminal A.

Under this condition no signal appears at the output of amplifier 101. The input signal applied to terminal B produces an output signal at both terminals 203 and 204 of amplifier 102, one of which is applied to terminal G of the And amplifier 103 and the other to the input diode $D_{61}$ of the Or amplifier 104.

Since no signal appears at terminal F of the And amplifier 103, no signal appears at either output of amplifier 106 or at output terminal D, as previously discussed.

The Or amplifier, requiring only one input to produce an output signal, produces an output signal and feeds it to the Inhibit amplifier 105. Without an output signal produced by the amplifier 106, the Inhibit amplifier permits the signal to pass through and a signal representing a binary "one" appears at terminal C.

Thus, the third rule of binary addition is satisfied. A binary "one" and "zero" have been added together and the binary sum of "one" without a carry has been produced.

Now considering the fourth situation when a signal representing a binary "one" appears at both the A and B inputs. In this situation, the output signals from amplifier 101 are applied to terminal F of the And amplifier 103 and terminal K of the Or amplifier 104. Output signals from amplifier 102 are applied to the other terminal G of the And amplifier 103 and to the other input terminal J of the Or amplifier 104.

The positive signal applied to the cathodes of diodes $D_{50}$ and $D_{51}$ cuts these diodes off and a signal appears in the primary of transformer $T_{50}$ through the capacitor $C_{52}$. The signal from the transformer $T_{50}$ is amplified by the amplifier portion of the And amplifier 103 and is fed to the amplifier 106 where it is further amplified.

Going back to the Or amplifier 104, the input signals applied to terminals K and J produce an output signal, which is fed to the Inhibit amplifier 105. A D.C. voltage of 10 volts is applied to diode $D_{62}$ to maintain the signal level of Or amplifier 104, so that the input signal appearing at the input circuit of the Inhibit amplifier 105 is at the proper level.

The output from the Inhibit amplifier 106 appears at the cathode of the diode $D_4$ of this amplifier to inhibit any signal output, so that no signal appears at the output terminal C representing a binary "zero."

In the meantime, the output signal from amplifier 106 is applied to the delay 107, where it is delayed that amount necessary to make the output appearing at terminal D exactly one time period later than the output appearing at terminal C in order to represent a carry.

From the foregoing, it is seen that the rule of binary addition, where a binary "one" plus a binary "one" results in the sum of a binary "zero" plus a binary "one" occurring at a later time period to represent a carry has been fulfilled.

By combining two of the half-adders shown in Fig. 5 a full binary adder can be produced.

Although in the embodiment shown in Fig. 5 several amplifiers, 101, 102 and 106, are shown which merely amplify and delay the signals, it is possible to eliminate some of these amplifiers by the adjusting of the gain of the other amplifiers and the provision of suitable delay circuits or lines.

It will be understood by those skilled in the art that various modifications of the invention may be made without departing from the spirit or scope of the invention.

What is claimed is:

1. In combination, a first semi-conducting device exhibiting enhancement properties, a second semi-conducting device exhibiting enhancement properties, a transformer having a primary and secondary winding, said primary winding connected between said first and second semiconducting devices, a first signal source connected to said first semi-conducting device, a second signal source connected to said second semi-conducting device, a third signal source connected to the primary of said transformer arranged to drive a forward current through either of the said two semi-conducting devices which is enabled by a signal from said first or second signal source at the time a signal from said third signal source is applied, an inductive device connected to the said third signal source circuit, a first output circuit connected to one end of the secondary of said transformer, a second output circuit connected to the other end of said transformer secondary and a unilateral conductive path connected from said second output circuit to the junction of said second semi-conductive device and said transformer primary.

2. The combination, according to claim 1, in which the wave form from said first and second signal source is a periodic recurring wave which has a position value over approximately half a cycle with the remaining portion of the cycle being approximately at zero potential, said signals being phased such that one signal is at a positive potential while the other is at approximately zero potential level.

3. The combination, according to claim 1, in which said first and second signal source has an operating frequency greater than said third signal source.

4. An amplifier utilizing the principles of the reverse transient phenomenon of rectifier devices comprising in combination, a first semi-conducting device exhibiting reverse transient phenomenon, a second semi-conducting device exhibiting reverse transient phenomenon, a current amplifying means with two input and two output connections having said input connections joined to said first and second semi-conducting devices, a first signal source connected to the input of said current amplifying means arranged to drive a unidirectional current through said semi-conducting devices, an inductive device connected in the first signal source circuit at the junction of said second semi-conducting device and input terminal of said current amplifying means, a second signal source connected to said first semi-conducting device, a third signal source connected to said second semi-conducting device, said second and third signal sources being operative to apply reverse and approximately zero level potentials across said semi-conducting devices in alternation, a first amplifier output circuit connected to one output terminal of said current amplifying means, a second amplifier output circuit connected to the second output of said current amplifying means, and a unidirectional conductive path connected from said second output circuit to said second semi-conductive device.

5. The combination, according to claim 4, in which said current amplifying means consists of a transformer whose natural resonant frequency is higher than the frequency of said first and second signal sources.

6. In combination, a first enhancement diode, a second enhancement diode, a transformer having a secondary and a primary, the primary of said transformer connected to like terminals of said enhancement diodes, an input circuit having a unilateral impedance connected in series with the primary of said transformer, an inductance connected in series with said input circuit, a first clock source connected to said first enhancement diode, a second clock source connected to said second enhancement diode, an output circuit taken from said secondary, a rectifier connected from the secondary of said transformer to the junction of said second enhancement diode and said transformer primary which provides additional carriers for said second enhancement diode when said second enhancement diode is conducting in the forward direction.

7. In combination, a first enhancement diode, a second enhancement diode, coupling means having input and output terminals, said input terminals connected between like electrodes of said first and second enhancement diodes, means for applying a forward current to said first and second diodes, means for enabling said first and second enhancement diodes in alternation to cause carriers to be stored in said diodes and to permit the recovery of said carriers, means for eliminating spurious signals in said forward current means, and means for providing a greater number of carriers for said second diode.

8. The combination of claim 7, wherein said means for providing a greater number of carriers for said second diode consists of a unilateral path from one of said coupling means output terminals to the junction of said coupling means input terminals and second diode.

9. The combination of claim 7, wherein said coupling means consists of a transformer having a primary and secondary winding, said primary having a greater number of turns than the secondary.

10. In combination, a first enhancement diode, a second enhancement diode, a transformer having a primary and secondary circuit, said primary connected between like electrodes of said first and second enhancement diodes, means for applying a unidirectional signal to said first and second enhancement diodes, means for enabling said first and second enhancement diodes in alternation to cause carriers to be stored and to permit the recovery of said carriers output means taken from said transformer secondary, means for causing a greater number of carriers to be stored in said second enhancement diode and feedback means coupled from said output means to the primary circuit of said transformer.

11. The combination of claim 10, wherein said feedback means will pass only unidirectional signals.

12. The combination, according to claim 10, and further including means connected to similar electrodes of said first and second enhancement diodes to prevent conduction of said enhancement diodes upon the application of a signal.

13. The combination, according to claim 10, wherein said means for enabling conduction of said first and second enhancement diodes includes a first signal source and second signal source connected respectively to similar electrodes of said first and second diodes each through an isolating resistor.

14. An amplifier circuit comprising a first semi-conductor rectifier exhibiting enhancement, a second semi-conductor rectifier exhibiting enhancement, a signal source coupled to said rectifiers for passing forward current through said rectifiers, a first driving source coupled to said first rectifier, a second driving source coupled to said second rectifier, said first and second driving sources for selectively driving enhancement current in a reverse direction through said rectifiers subsequent to an application of a signal from said signal source, load means coupled to said rectifiers and responsive to said enhancement current, unidirectional current means coupled from said load means to said second rectifier which adds a greater number of carriers to said second rectifier during the time a forward current is passing through said second rectifier and an inductance connected to the junction of said second semi-conductor rectifier and said load means.

15. The combination of claim 14, and further including means for applying a signal from said signal source to the junction of said second semi-conductor rectifier and said load means.

16. The combination of claim 14, and further including feedback means coupling signals from said output means to said signal source circuit whereby a train of signals appears at said load means upon the application of a signal from said forward signal source.

17. The combination of claim 16, wherein the frequency of said first and second driving source is greater than the frequency of said signal source.

18. The combination of claim 16, wherein said feedback means comprises a unidirectional path poled to pass signals of positive polarity only.

19. The combination of claim 18, wherein said feedback path includes signal limiting means.

20. The combination of claim 16, wherein said first and second driving sources supply a series of periodic waves, each of which has a positive value over approximately half a cycle with the remaining portion of the cycle being approximately at zero potential, said signals of said first and second driving source being phased such that the signal from one source is at a positive potential while the signal from the other source is at approximately zero potential level.

21. The combination of claim 16 and further including means coupled to said first and second semi-conducting rectifiers to prevent conduction of said rectifiers thereby restoring the amplifiers to one of the two stable states wherein no signal appears at said load means.

22. The combination of claim 21, wherein said rectifier conduction means consists of a unidirectional signal source connected to similar elements of said first and second rectifiers.

23. The combination of claim 22, wherein said rectifier conduction means connected to each of said rectifiers includes a source of signals and a rectifier poled to pass positive signals only.

24. The combination of claim 16 wherein said feedback means comprises a unidirectional path poled so as to pass signals from said output means through said semi-conductor rectifiers in a forward direction so as to store carriers therein.

25. An amplifier which can assume either of two stable states in response to signals comprising a first enhancement diode rectifier, a second enhancement diode, a coupling transformer having a primary and secondary winding, said primary winding having two terminals and said secondary winding having two end terminals and a center tap, one terminal of said transformer primary connected to the anode of said first diode, the second terminal of said transformer primary connected to the anode of said second diode, an input signal circuit having a rectifier poled to pass positive signals connected to the junction of said first diode and one primary winding terminal, an inductance connected in said signal source circuit at the junction of said second diode and second primary terminal, a first clock source connected to the cathode of said first diode through a first resistor, a second clock source connected to the cathode of said second diode through a second resistor, a first output taken from one end of the terminal of said transformer secondary having a fourth rectifier poled to pass positive signals, a connection from the other end of said transformer secondary connected to the anode of said second diode through a fifth rectifier poled to pass positive signals, a feedback path connected to said first output and joined to the anode of said first diode having a sixth rectifier and a resistor, said sixth rectifier poled to pass positive signals only, a source of "off" pulses connected to the cathode of said first diode through a seventh rectifier poled to pass positive pulses and a connection to the cathode of said second diode through an eighth rectifier poled to pass positive pulses from said source of "off" pulses.

26. The combination of claim 25, and further including a second input signal circuit having a rectifier poled to pass positive signals connected to the junction of the anode of said second enhancement diode and the second terminal of said transformer primary.

27. The combination of claim 26, wherein said first and second input signal circuits are tied together to form a single input circuit.

28. An Or double diode amplifier comprising in combination, a first enhancement diode, a second enhancement diode, a transformer having a primary and secondary winding, said primary winding connected between like elements of said first and second diodes, a first signal source connected to said first diode, a second signal source connected to said second diode, a third signal source connected to the primary of said transformer, a fourth signal source connected to the primary of said transformer, said third and fourth signal sources are arranged to drive a forward current through either of said two enhancement diodes which is enabled by a signal from said first or second signal source at the time a signal is applied at either or both of said third or fourth signal sources, an inductive device connected in series with the primary of said transformer, an output circuit connected across one end of the secondary of said transformer, and a unilateral conductive path connected from the other end of the said transformer secondary to the junction of said second diode and said transformer primary.

29. An Inhibit double diode amplifier comprising the combination of claim 28, and further including means for applying a signal to said amplifier to prevent conduction of said first and second diodes.

30. An And double diode amplifier comprising in combination, a first enhancement diode, a second enhancement diode, a transformer having a primary and secondary winding, said primary winding connected between like elements of said first and second diodes, a first signal source connected to said first diode, a second signal source connected to said second diode, means connected to the primary of said transformer having two input terminals and arranged to produce a signal output upon the application of a signal to both of said input terminals, said means arranged to drive a forward current through either of said two enhancement diodes which is enabled by a signal from said first or second signal source at the time signals are applied to said means, an inductive device connected in series with said transformer primary, an output circuit connected across one end of said transformer secondary and a unilateral conductive path connected from the other end of said transformer secondary to the junction of said second diode and said transformer primary.

31. An Inhibit double diode amplifier comprising the combination of claim 30, and further including means for applying a signal to said amplifier to prevent conduction of said first and second diodes.

32. The combination of claim 31, wherein said means for applying the inhibit signal consists of a third signal source connected to said second diode and a resistor connected between said second signal source and said second diode.

33. The combination of claim 32, wherein said means for applying the inhibit signal consists of a third signal source connected to said first diode and a resistor connected between said first signal source and said first diode.

34. An Inhibit double diode amplifier comprising the combination of claim 7, and further including means for applying a signal to said amplifier to prevent conduction of said first and second diodes.

35. A binary adder for combining two pulse trains, each representing the digits of binary numbers and fed simultaneously digit by digit to separate input terminals, comprising a first input terminal, a second input terminal, an And double diode enhancement amplifier connected to one of said input terminals, an Or double diode enhancement amplifier connected to said second input terminal, a connection for applying signals from said first terminal to said Or enhancement amplifier, a connection for applying signals from said second input terminal to said And enhancement amplifier, an Inhibit double diode enhancement amplifier connected to the output of said Or enhancement amplifier, a connection from the output of said And enhancement amplifier to said Inhibit enhancement amplifier which inhibits the action of said Inhibit amplifier upon the presence of a pulse from said And amplifier, a first output terminal connected to the output of said Inhibit enhancement amplifier, delay means connected to the output of said And enhancement amplifier and a second output terminal connected to said delay means.

36. A binary half-adder for combining two binary numbers, each represented by pulse trains and fed simultaneously digit by digit, comprising a double diode enhancement amplifier having the characteristics of an And circuit, a double diode enhancement amplifier having the characteristics of an Or circuit, a double diode enhancement amplifier having the characteristics of an Inhibit amplifier, means for feeding signals representing said digits of each pulse train simultaneously to said And amplifier and said Or amplifier, means for applying output signals from said And and Or amplifiers to said Inhibit amplifier under predetermined conditions, and delay means connected to the output of said And amplifier, a first output terminal connected to said delay means and a second output terminal connected to said Inhibit amplifier, whereby the output signals appearing at said outputs represent the arithmetic sum of said binary numbers in accordance with the rules of binary arithmetic.

37. The combination of claim 36, and further including a first double diode enhancement amplifier having two outputs connected between said first input terminal, said And amplifier, and said Or amplifier, a second double diode enhancement amplifier having two outputs connected between said second input terminal, said And amplifier and said Or amplifier, and a third double diode enhancement amplifier connected between said And amplifier and said delay means.

References Cited in the file of this patent

UNITED STATES PATENTS

| | | |
|---|---|---|
| 2,693,907 | Tootill | Nov. 9, 1954 |
| 2,694,521 | Newman et al. | Nov. 16, 1954 |
| 2,757,243 | Thomas | July 31, 1956 |
| 2,758,787 | Felker | Aug. 14, 1956 |
| 2,762,870 | Sziklai | Sept. 11, 1956 |

OTHER REFERENCES

Radio-Electronic Engineering, January 1955, pages 18, 19, 32 and 33, "Diode Amplifier," by A. W. Holt.